United States Patent [19]

Furman et al.

[11] 4,021,789
[45] May 3, 1977

[54] SELF-ALIGNED INTEGRATED CIRCUITS

[75] Inventors: Anatol Furman, Fairfax; Howard Leo Kalter, Colchester; Johann Werner Nagel, Underhill, all of Vt.

[73] Assignee: International Business Machines Corporation, Armonk, N.Y.

[22] Filed: Sept. 29, 1975

[21] Appl. No.: 617,462

[52] U.S. Cl. .......................... 340/173 R; 148/187; 307/279; 357/54; 427/85

[51] Int. Cl.² ................... G11C 11/40; H03K 3/38; H01L 7/44; H01L 29/34

[58] Field of Search ............... 340/173 R; 307/279, 307/304; 357/40, 54, 23; 427/85; 148/187, 188

[56] References Cited

UNITED STATES PATENTS

| | | | |
|---|---|---|---|
| 3,836,894 | 9/1974 | Cricchi | 340/173 R |
| 3,889,287 | 6/1975 | Powell | 340/173 R |
| 3,893,152 | 7/1975 | Lin | 340/173 R |
| 3,931,632 | 1/1976 | Uchida et al. | 340/173 R |

*Primary Examiner*—Daryl W. Cook
*Attorney, Agent, or Firm*—Stephen J. Limanek

[57] ABSTRACT

Semiconductor integrated circuits, including, e. g., field effect transistors and memory cells employing field effect transistors, are formed by providing at a surface of semiconductor substrate a pair of isolation mediums and a plurality of spaced apart conductive lines extending between the isolation mediums. The conductive lines, such as polycrystalline silicon or polysilicon lines, are preferably thermally, chemically or anodically self insulatable in an unmasked batch process step and are made of a material suitable for defining a barrier to a dopant for the semiconductor substrate. Signal or bias voltages are applied to selected or predetermined conductive lines to provide control electrodes or field shields for the transistors. When the substrate has deposited on its surface an insulating medium made of a dual dielectric, such as silicon dioxide-silicon nitride, the dopant may be ion implanted through the insulating medium to form, e. g., the source and drain electrodes of the transistors as defined by the isolation mediums and the conductive lines. Other elements may be added to the structure to form, e. g., a memory cell. By depositing a conductive medium over the insulated conductive lines, the medium may be appropriately etched to provide desired access lines, capacitor electrodes, ground planes or additional field shields for the cells.

25 Claims, 7 Drawing Figures

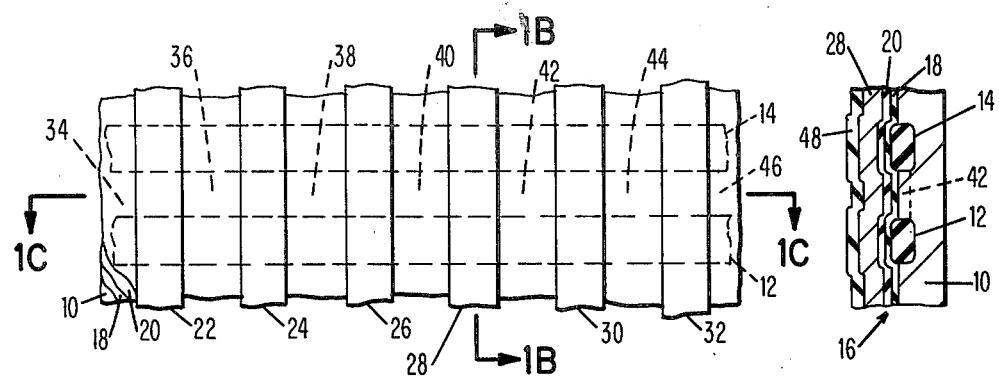
FIG. 1A
FIG. 1B
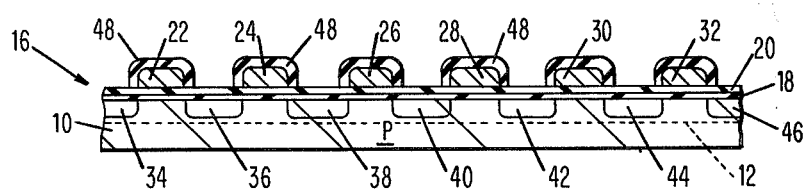
FIG. 1C
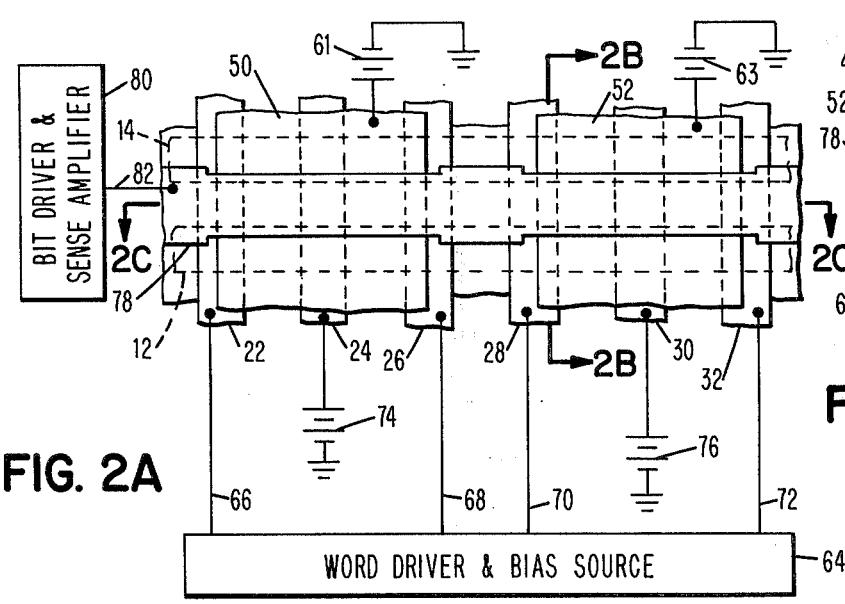
FIG. 2A
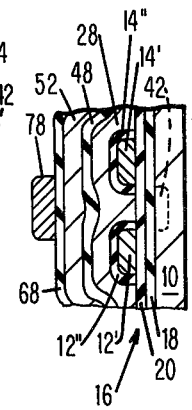
FIG. 2B
FIG. 3
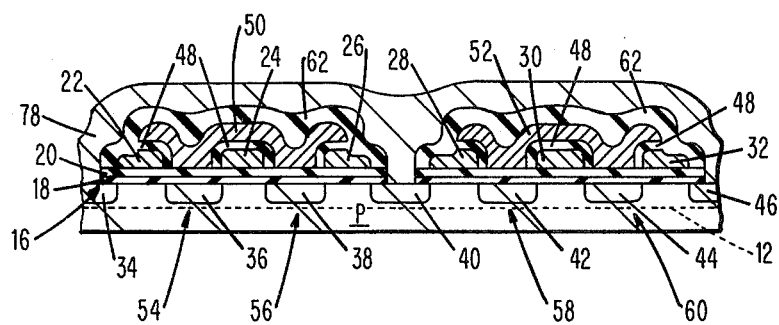
FIG. 2C

SELF-ALIGNED INTEGRATED CIRCUITS

BACKGROUND OF THE INVENTION

1. Field of the Invention

This invention relates to self-aligned integrated circuits and more particularly to integrated circuits which employ field effect transistors. More specifically, the invention relates to a process for making self-aligned memory cells which form a very high density memory array.

2. Description of the Prior Art

Integrated circuits, particularly those employing field effect transistors formed in a semiconductor substrate, have achieved very high densities of active and passive components. To achieve these high densities various processes have been developed to reduce the size of each circuit and to reduce the area required for isolation within the substrate between the circuits. Furthermore, in order to further increase the densities in the integrated circuits, for example, in the memory technology, very simple circuits have been developed which utilize a very small amount of surface area on the semiconductor substrate. One of the simplest circuits for providing a memory cell is described in commonly owned U.S. Pat. No 3,387,286, filed July 14, 1967, by R. H. Dennard. This cell employes a single field effect transistor as a switch for coupling a capacitor to a bit sense line. In also commonly owned U.S. Pat. Nos. 3,811,076, by W. M. Smith, and 3,841,926, by R. H. Garnache, both filed Jan. 2, 1973, there is disclosed a one device field effect transistor memory cell of the type described in the above identified Dennard patent which utilizes a layer of polycrystalline silicon as a field shield and as an electrode for a storage capacitor in order to improve cell density. To further improve the density of the cells described in U.S. Pat. Nos. 3,811,076 and 3,841,926, the process for making the cells utilizes a dual layer of silicon nitride and silicon dioxide and polysilicon conductive layers or lines.

In U.S. Pat. No. 3,771,147, filed Dec. 4, 1972, there is disclosed a one device field effect transistor memory cell wherein a first level metal, tungsten, is used to provide a self-aligned gate, a single contact at the drain is utilized for two adjacent cells and a metallic layer held at a reference potential serves as an electrode for the storage capacitor.

In U.S. Pat. No. 3,648,125, filed Feb. 2, 1971, there is disclosed a process for making integrated circuits which includes forming electrically isolated pockets by a grid of oxidized silicon extending into silicon material, and in the periodical, *Electronics*, Sept. 11, 1972, page 31, there is a suggestion that the use of oxide isolation technqiues be employed for making single transistor memory cells.

Electrical isolation techniques wherein a polysilicon grid is used to produce islands of single crystal silicon is disclosed in U.S. Pat. No. 3,736,193, filed July 29, 1969.

Field effect transistors having silicon gates with a nitride-oxide gate dielectric are suggested in U.S. Pat. No. 3,699,646, filed Dec. 28, 1970, and in the periodical, *Electronics*, dated Aug. 2, 1971, on page 74.

By employing the techniques disclosed in the above identified patents and articles, the semiconductor industry has produced semiconductor circuits or cells which contain thousands of circuits or cells on each small semiconductor substrates or chips, which are generally made of silicon.

SUMMARY OF THE INVENTION

It is an object of this invention to provide an improved process for making integrated circuits which further increase the component density in semiconductor chips.

It is another object of this invention to provide a very high density of field effect transistors on a semiconductor chip by forming the elements of the transistors with improved self-aligning techniques.

Yet another object of this invention is to provide integrated circuits employing both active and passive components at densities no less than those attainable for circuits employing only the field effect transistors.

A further object of this invention is to provide a semiconductor integrated circuit memory cell employing active and passive components which is insensitive to mask level-to-level misalignment.

Still another object of this invention is to provide a memory cell employing both active and passive components in a semiconductor substrate which utilizes on the surface of the semiconductor substrate only the area required for producing a single field effect transistor.

Yet a further object of this invention is to provide an improved process for making in a semiconductor substrate an array of high density field effect transistors having elements all of which are self-aligned and wherein the transistors are electrically isolated from each other within the substrate.

Still a further object of this invention is to provide a process for making a memory array employing cells each having a single field effect transistor which has a density two to three times the density of arrays made by known processes.

In accordance with the teachings of an aspect of this invention, a method is provided for making a field effect transistor in a semiconductor substrate by forming a plurality of spaced apart isolation mediums at the surface of the substrate and a plurality of spaced apart conductive lines arranged to extend between an adjacent pair of isolation mediums and insulated from the substrate. The surface areas of the substrate bound by the isolation mediums and conductive lines define source and drain electrodes of the transistor with the conductive line disposed between a source and a drain electrode forming the gate electrode of the transistor. The insulation on the substrate surface beneath the conductive lines may be a dual layer insulator having a first layer of silicon dioxide and a second layer of silicon nitride and the source and drain electrodes may be formed by using well known ion implantation techniques.

In accordance with a further aspect of this invention, a very small size memory cell is made by depositing a conductive material over the dual layer insulator segment covering the source electrode of the transistor to form a storage capacitor between the source electrode and the conductive material. The segment of the dual layer insulator over the drain electrode may be etched away and an appropriate conductive contact made to this electrode. By applying appropriate word pulses to the gate electrode and bit pulses to the drain electrode and a reference voltage to the conductive medium, a small one device memory cell is provided of the type described and claimed in the above identified Dennard patent. Furthermore it can be seen that by applying appropriate reference or bias voltages to the conductive lines adjacent to the gate electrode, the cell becomes isolated in one dimension along the substrate surface by the adjacent lines which act as field shields and in the other dimension by the isolation mediums.

The isolation mediums may be in the form of a recessed oxide in the semiconductor substrate or as conductive lines forming a field shield in a direction orthogonal to the field shield provided by the adjacent lines. The process for making the cell is simplified by having conductive lines made of a material capable of being thermally, chemically or anodically self insulatable in unmasked batch process steps.

The foregoing and other objects, features and advantages of the invention will be apparent from the following more particular description of preferred embodiments of the invention, as illustrated in the accompanying drawings.

BRIEF DESCRIPTION OF THE DRAWINGS

FIG. 1A is a plan view illustrating a matrix on a semiconductor substrate used for forming an array of field effect transistors in accordance with the invention, FIG. 1B is a section taken through FIG. 1A at 1B—1B, FIG. 1C is a section taken through FIG. 1A at 1C—1C, FIG. 2A is a plan view of an embodiment of a semiconductor memory array of the present invention, FIG. 2B is a section taken through FIG. 2A at 2B—2B, FIG. 2C is a section taken through FIG. 2A at 2C—2C, and FIG. 3 is a section similar to that illustrated in FIG. 2B but of another embodiment of the semiconductor memory array of the present invention.

DESCRIPTION OF THE PREFERRED EMBODIMENTS.

Referring to FIGS. 1A, 1B and 1C in more detail, there is shown a semiconductor substrate 10 having recessed oxide strips 12 and 14 formed therein to a depth sufficient to hold off high voltage excursions. These recessed oxide strips 12 and 14 may be made by any of the well known recessed oxidation processes. Disposed on the surface of the semiconductor substrate 10 is a dual layer insulator 16 having a first layer 18 made of silicon dioxide and a second layer 20 made of silicon nitride. Disposed orthogonal to the direction of the isolation strips 12 and 14 are a plurality of conductive lines 22, 24, 26, 28, 30 and 32 overlying the dual layer insulator 16. Source and drain electrodes 34, 36, 38, 40, 42, 44 and 46 are provided in the P-type semiconductor substrate 10, preferably made of silicon, by introducing suitable N-type impurity materials therein as is well known. The source and drain electrodes 34 through 46 may be formed in substrate 10 by employing well known ion implantation techniques, the ions penetrating through the silicon dioxide and silicon nitride layers 18 and 20, respectively, to preferred depths in substrate 10. As desired, a layer of insulation 48, indicated in FIGS. 1B and 1C, is applied to the conductive lines 22 through 32 to given thicknesses.

It can be seen that the structure illustrated in FIGS. 1A, 1B and 1C produces several field effect transistors which may be connected in any suitable manner. For example, electrode 34 may be used as a drain electrode and electrode 36 as a source electrode to form an N-channel field effect transistor having conductive line 22 as the gate electrode by making appropriate connections to electrodes 34 and 36 through dual layer insulator 16 and through insulator 48 to conductive line 22. Other electrodes, such as, 38 and 40, may be used as the selected drain and source electrodes, respectively, in a transistor utilizing conductive line 26 as the gate electrode. Furthermore, it can be seen that by applying an appropriate bias potential on, for example, conductive line 24, the transistor utilizing conductive line 22 as a gate electrode is isolated from the transistor utilizing conductive line 26 as the gate electrode. Other conductive lines and source and drain electrodes may be used to form other transistors and other conductive lines may be used as field shields for isolating the transistors from one another by simply applying an appropriate bias voltage to the other conductive lines in a well known manner. It can also be seen that the source and drain electrodes, for example, electrode 42 as shown in FIG. 1B, has one dimension which is defined by the isolation strips 12 and 14 and another dimension which is defined by conductive lines 28 and 30 as seen more clearly in FIG. 1C. It should be noted that the area of the electrode is not determined by the alignment of masks used to produce the isolation strips 12 and 14 or the conducting lines 28 and 30 but by the geometries produced or spacings formed in each of the masks. Accordingly, the source and drain electrodes are not affected by the alignment of masks and, therefore, provision need not be made for misalignment of masks when determining the sizes of the transistors.

A specific process which may be used to produce the structure illustrated in FIGS. 1A, 1B and 1C includes the following sequence of steps. The recessed oxide strips 12 and 14 are first developed within the semiconductor substrate 10 to a depth sufficient to hold off high voltage extremes. The surface of the semiconductor substrate is stripped and cleaned. On the clean surface the thin gate oxide 18, about 300 to 400 Angstroms thick, is thermally grown followed by the deposition of a layer of silicon nitride 20, about 200 to 300 Angstroms thick, to form the dual layer insulator 16. A layer of doped polysilicon is then deposited, e.g., by decomposition of silane in the presence of a boron containing gas, such as Diborane, at a temperature of about 900° C. By well known masking and etching techniques, the polysilicon is formed into the conductive lines 22 through 32 arranged orthogonal to the recessed oxide strips. To form these lines, a photoresist is applied, exposed through a mask and developed in the usual manner. A suitable etchant for the polycrystalline silicon is hydrofluoric acid and nitric acid in water or hydrofluoric acid, nitric acid and acetic acid in admixture. The source and drain electrodes 34 through 46 are then formed by ion implanting through the silicon nitride and the polysilicon is simultaneously doped to provide low impedance conductive lines 22 through 32. The conductive polysilicon lines 22 through 32 are then heavily oxidized by a well known thermal process to produce an insulating layer 48 of approximately 1500 Angstroms. This thermal oxidation step also anneals the implanted junction and allows subsequent conductor depositions without the need for further insulation on the conductive lines 22 through 32. It should also be noted that the junctions between the electrodes 34 through 46 and the p-type semiconductor substrate 10 are completely covered by the thin oxide nitride insulator 16 during the entire process. In order to expose the source and drain electrodes 34 through 46 for providing a conductive contact thereto, the oxide-nitride insulator 16 is removed in the regions of the source and drain electrodes by a known unmasked dip etch process, using hydrofluoric acid, which etches away all of the exposed oxide-nitride insulator in the source and drain electrode regions, but due to the thickness of the insulating layer 48, only an insignificant portion of it is etched away. A layer of metal, e.g., aluminum, is then deposited so as to contact the source and drain electrodes and it is then appropriately etched to form desired ohmic connections or lines.

It should be noted that the areas of the source, gate and drain electrodes are determined by an orthogonal application of the recessed oxide strips 12 and 14 and the conductive polysilicon lines 22 through 32. Alignment of the conductive lines with respect to the recessed oxide strips does not alter the source, gate and drain areas or the width to length ratios of the gate regions formed under the gate electrodes. The transistor width and length is determined in each instance on a unique mask and are functions of etch bias alone. The source and drain electrodes 22 through 32 are made available for contact by a simple dip etch of the thin gate insulator 16. No masked contact hole is required. The source and drain electrode contact metal may overlap a gate electrode or field shield without producing a short since the conductive polysilicon lines 22 through 32 have been thermally oxidized to provide the necessary insulation. To produce this structure, three masks are required. A fourth mask is needed to contact the polysilicon lines and a block or segment of the fourth mask is used for contacting the substrate 10 where necessary or desirable. The gate electrode connections of the transistors may be any of the conductive lines 22 through 32 made of strips of polysilicon or the polysilicon may be limited to the gate area and a metal strip or line may contact the polysilicon at the gate area to provide an additional degree of freedom for wiring.

The structure illustrated in FIGS. 1A, 1B and 1C, forming an array of field effect transistors, may be used to produce various circuits employing not only active components but also passive components, such as capacitors. In FIGS. 2A, 2B and 2C, there is illustrated a memory array employing cells of the single or one device type as disclosed in the above identified Dennard patent, as well as in the Smith and Garnache et al. patents. As illustrated in FIGS. 2A, 2B and 2C, the elements from 10 through 48 are similar to the elements 10 through 48 shown in FIGS. 1A, 1B and 1C. To form the memory cell array, reference or ground planes 50 and 52 are disposed over the insulated conductive lines 22 through 32. As can be seen more clearly in FIG. 2C, the ground plane 50 is insulated from conductive lines 22, 24 and 26 by the insulating layer 48. Also it should be noted that the ground or reference plane 50 is in contact with the surface of the silicon nitride layer between conductive lines 22 and 24 and between conductive lines 24 and 26 to form with a current-carrying electrode 36, preferably a source electrode, a storage capacitor 54, and with electrode 38, also preferably a source electrode, a storage capacitor 56. Ground or reference plane 52 is similarly disposed over conductive lines 28, 30 and 32 to form with electrode 42 a storage capacitor 58 and with electrode 44 a storage capacitor 60. The reference planes 50 and 52 may be connected to voltage sources 61 and 63, respectively. An insulating layer 62 is formed over the ground planes 50 and 52. A word driver and bias source 64 has output 66, 68, 70 and 72 connected to conductive lines 22, 26, 28 and 32, respectively. These conductive lines 22, 26, 28 and 32 are used as word lines for the memory cell. Conductive lines 24 and 30 are used as field shields by applying an appropriate reference voltage to them from voltage sources 74 and 76, respectively. By providing contact holes in dual layer insulator 16 at electrodes 34, 40 and 46, for use as drain electrodes, an appropriate bit line 78 may be ohmically connected to these drain electrodes. A bit driver and sense amplifier 80 has an output 82 connected to the bit line 78. It can be seen that the segment of the memory array illustrated in FIGS. 2A, 2B and 2C provides for memory cells, each coupled to bit line 78 and controlled by gate electrodes 22, 26, 28 and 32. Isolation between the cells is provided by conductive lines 24 and 30. More specifically, the four cells of the memory array include a first cell which has storage capacitor 54 and a transistor formed by the gate electrode 22, drain electrode 34, and source electrode 36, a second cell having storage capacitor 56 and a second transistor formed by gate electrode 26, drain electrode 40 and source electrode 38, a a third cell having storage capacitor 58 and a third transistor having gate electrode 28, drain electrode 40 and source electrode 42, and a fourth cell having storage capacitor 60 and a fourth transistor having a gate electrode 32, a drain electrode 46 and source electrode 44. As is known, with the bias voltage applied to ground planes 50 and 52, the source electrodes 36, 38, 42 and 44 do not require doping by ion implantation. Although only one row of cells connected to bit line 78 is illustrated in the drawing of FIGS. 2A, 2B and 2C, it should be understood that additional rows are provided having bit lines parallel to bit line 78.

In the known operation of this type of memory array, in order to write information into a cell, for example, into storage capacitor 56, a pulse is applied to the gate electrode 26 from the word driver and bias source 64 through output 68 to render the transistor having electrodes 26, 38 and 40 conductive. If a 1 bit of information is to be stored in capacitor 56, a pulse is also applied to the bit line 78 from the bit driver and sense amplifier 80 through output 82 to place a charge on capacitor 56. If a 0 bit of information is to be stored in capacitor 56, a pulse would not be applied to bit line 78 and, therefore, capacitor 56 would not be charged. In order to read information stored in capacitor 56, a pulse from the work driver and bias source 64 is applied to gate electrode 26 through output 68 to again turn on the transistor having electrodes 26, 38 and 40. If a 1 has been stored in capacitor 56, the capacitor will have a charge thereon which will be discharged through the gate region of the transistor between electrodes 38 and 40 to bit line 78. This charge is detected in the sense amplifier 80. If a 0 bit of information had been stored in capacitor 56, the capacitor could not discharge and, therefore, charge would not be sensed by sense amplifier 80. It can be seen that in order to write information into storage capacitor 58 or to read information therefrom, the transistor having gate electrode 28, drain electrode 40 and source electrode 42 is employed, a pulse being applied from word driver and bias source 64 to gate electrode 28 through output 70 and a bit pulse, if necessary, being applied to bit line 78 in the same manner as described hereinabove in connection with the storage of information in capacitor 56. Sense amplifier 80 is also used to read the information from storage capacitor 58. Likewise storage capacitors 54 and 60 utilize the common bit line 78 but are driven by the word driver and bias source 64 from lines 66 and 72, respectively.

Although only four cells are shown coupled to the bit line 78, it should be understood that many more cells similarly arranged may be coupled to this line. It should also be noted that drain electrode 40 is used as a common drain electrode for accessing both the storage capacitor 56 and the storage capacitor 58. It should be noted further that when, for example, storage capacitor 58 is being accessed under the control of gate electrode 28, a bias voltage from the word driver and bias source 64 may be applied to output 68 to render conductive line 26 active as a field shield isolating the cell having storage capacitor 58 from voltage excursions which may occur in the semiconductor substrate 10 at its left, as shown in FIG. 2C of the drawing, while the conductive line 30 connected to the bias voltage source 76 acts as a field shield for the cell having storage capacitor 58 from all voltage excursions which may occur in the semiconductor substrate 10 at its right. It can be seen that with the conductive lines adjacent to both sides of the gate electrode of a transistor being used as field shields to isolate the memory cell in one dimension and with the recessed oxide strips 12 and 14 isolating the cells in the other dimension, each of the cells are fully protected from voltage excursions which may occur in the semiconductor substrate 10 outside of the selected or addressed cell area. Since each of the cells are completely isolated from the other cells in the array and since they are formed free of mask misalignments, a highly dense memory array is produced.

A specific process for making the memory cell array illustrated in FIGS. 2A, 2B and 2C may include the process steps for producing the structure shown in FIGS. 1A, 1B and 1C. However, the dip etch step is not used until after the reference or ground planes have been formed. The process for making the ground planes 50 and 52, an insulation layer 62 and the bit line 78 for the memory cell array includes the following additional steps. A conductive layer of material, preferably doped polysilicon, is deposited over the insulated conductive lines 22 to 32. The polysilicon layer is then etched to form ground plane 50 over source electrodes 36 and 38 and ground plane 52 over source electrodes 42 and 44 which act as capacitor plates. The polysilicon ground planes 50 and 52 are oxidized to produce a thick insulating layer of approximately 3000 Angstroms. The dip etch process is then employed to provide an opening in the thin oxide-nitride insulator 16 drain contacting the drain electrodes 34, 40 and 46. A metal layer, preferably of aluminum, is deposited in contact with drain electrodes 34, 40 and 46 and the metal layer is suitably etched to form the bit line 78.

It should be noted that in forming the memory cell array the storage capacitor plates or ground planes 50 and 52 need not be critically aligned because of the overlap utilized at the oxidized polysilicon lines 22 through 32. The only alignment required for the capacitor plates 50 and 52 is that the edges thereof fall over the gate electrodes 22 and 26, and 28 and 32, respectively. Because there is no gap in the storage capacitor, the capacitor size is not a function of alignment. If desired, by using an additional mask, the silicon nitride in the storage capacitor may be removed to increase the storage capacity without decreased gate oxide thickness which would decrease the gate reliability. The thin dielectric reliability of the storage capacitor can be improved, if desired, by properly biasing the ground plates 50 and 52. It should be further noted that in place of the polysilicon for the gate electrodes, field shields and capacitor plates, a refractory metal, such as tantalum, may be used with anodic tantalum oxide forming the insulation barrier between conductive members of the memory array. When tantalum is used, the silicon nitride is not required to inhibit thick oxide growth over source and drain electrode regions, and the drain electrode region silicon dioxide insulator layer may still be opened with an unmasked dip etch. It should also be noted that materials other than polycrystalline silicon or tantulum may be used for the conductive lines 22 to 32 and ground planes 50 and 52, however, it is preferred that the conductive material be used which are thermally, chemically or anodically self insulatable in an unmasked batch process step.

It has been found that the memory cells of the array of the present invention are two to three times denser than the cells of other memory arrays because the cells are completely self-aligned and immune to mask shifts. Because of the self-alignment feature, the parasitic and device capacitances are constant and, therefore, there is no need to expand the cell size in order to provide for worst case transfer ratio for signal requirements. There is no lost area on the surface of the chip because of conductor spacing and no diffusion extension is required to connect the device source to the storage capacitor since the device source is an electrode of the storage capacitor. Contact openings to the drain electrodes through insulator 16 are made without a mask and etch procedure, that is, only an unmasked dip etch process is required. Finally, there is no level to level image size bias needed to account for level to level nesting on any critical dimension since all critical dimensions are self locating or self masking.

In FIG. 3 there is illustrated another embodiment of a memory cell array in accordance with the teachings of the present invention. FIG. 3 is a section of the memory array similar to the section shown in FIG. 2B. The essential differences between the memory array illustrated in FIG. 3 of the drawing and the memory array illustrated in FIGS. 2A, 2B and 2C is that the recessed oxide strips 12 and 14 used for isolation in one dimension have been replaced by conductive lines 12' and 14', having insulators 12'' and 14'', respectively, disposed over the dual layer insulator 16. By applying suitable bias voltages to the conductive lines 12' and 14' they may be used as field shields in a manner similar to the field shields illustrated in FIGS. 2A and 2C at 24 and 30. Accordingly, in the embodiment of the invention illustrated in FIG. 3, each cell is completely isolated within the semiconductor substrate 10 by field shields in both dimensions. The memory array of the embodiment illustrated in FIG. 3 operates in a manner similar to that described in connection with the operation of the memory array illustrated in FIGS. 2A, 2B and 2C. The conductive lines 12' and 14' are preferably polysilicon lines, which if used, provide in the embodiment illustrated in FIG. 3 three layers of self insulating polysilicon between the surface of semiconductor substrate 10 and bit line 78.

Although the isolation medium strips have been disclosed as being recessed oxide strips 12 and 14 or as conductive lines 12' and 14', e.g., polysilicon, forming field shields, it should be understood that other isolation medium strips may be employed, if desired, such as thick oxide, aluminum oxide, tantalum oxide or highly doped semiconductor substrate strips.

The bit line 78 although indicated as being made of metal, may in both memory array embodiments, be made, if desired, of polysilicon in order to produce an array which has all conductive lines made of conductive polysilicon strips which are readily self-insulated by appropriate oxidation. An advantage of using the oxidized polysilicon strips is that the incidence of shorts between conductive lines would be almost entirely eliminated. Also, if desired, the conductive lines in the memory arrays may be made of oxidizable refractory metal to produce thinner and lower impedance lines with the intended improvements in surface topology and performance.

While the invention has been particularly shown and described with reference to preferred embodiments thereof, it will be understood by those skilled in the art that various changes in form and details may be made therein without departing from the spirit and scope of the invention.

What is claimed is:

1. A method for forming an electrical circuit including a field effect transistor in an isolated pocket of a semiconductor material, said transistor having a control electrode and at least one current carrying electrode comprising the steps of:
   forming a pair of spaced apart isolation strips at the surface of said semiconductor material;
   extending between said isolation strips substantially orthogonal thereto a plurality of spaced apart conductive lines insulated from the surface of said semiconductor material, said conductive lines being made of a material suitable for defining a barrier to a dopant for said semiconductor material;
   forming at least one impurity region defined by said isolation strips and said conductive lines in said semiconductor material with said dopant for producing said at least one current carrying electrode of said field effect transistor;
   applying a signal voltage to a selected one of said lines, said selected line being said control electrode of said field effect transistor; and
   applying a reference voltage to one of said conductive lines adjacent said selected line to form a field shield for said field effect transistor.

2. A method as set forth in claim 1 wherein said conductive lines are disposed in a direction substantially perpendicular to said isolation strips.

3. A method as set forth in claim 2 wherein another of said conductive lines adjacent said selected line opposite said one of said conductive lines has a reference voltage applied thereto to form another field shield for said field effect transistor.

4. A method as set forth in claim 3 wherein said conductive lines are formed on a dual layer insulator.

5. A method as set forth in claim 4 wherein said dual layer insulator is made of silicon dioxide and silicon nitride layers.

6. A method as set forth in claim 5 wherein said at least one impurity region is formed by introducing said dopant into said semiconductor material through said silicon nitride layer by ion implantation.

7. A method as set forth in claim 2 wherein isolation strips are arranged parallel to each other.

8. A method as set forth in claim 7 wherein said isolation strips are in the form of oxide strips recessed in said semiconductor material at the surface thereof.

9. A method as set forth in claim 7 wherein said isolation strips are in the form of additional conductive lines insulated from the surface of said semiconductor material.

10. A method as set forth in claim 9 wherein said conductive lines are made of a material which is self insulatable in an unmasked batch process.

11. A method as set forth in claim 1 further comprising applying voltages to said current-carrying and control electrodes.

12. A method as set forth in claim 1 further comprising forming a capacitor on said semiconductor material in an area defined by said pair of isolation strips and said selected line and said one of said conductive lines.

13. A method as set forth in claim 12 wherein electrodes of said capacitor are formed by said semiconductor material and a conductive material insulated from said semiconductor material.

14. A method as set forth in claim 13 further comprising applying a bias voltage to said conductive material and a signal to said at least one current-carrying electrode.

15. A method for forming an isolated pocket in a semiconductor material and an electrical circuit therein including a field effect transistor comprising the steps of:
   forming a first plurality of parallel isolation strips at the surface of said semiconductor material;
   disposing in a direction substantially perpendicular to said isolation strips a plurality of parallel conductive lines insulated from the surface of said semiconductor material, said conductive lines being characterized as a barrier to a dopant of said semiconductor material;
   forming impurity regions defined by said isolation strips and said conductive lines in said semiconductor material with said dopant for producing source and drains for said field effect transistor;
   applying a signal voltage to a selected line of said conductive lines, said selected line being a gate electrode of said field effect transistor; and
   applying a reference voltage to one of said conductive lines adjacent said selected line to form a shield for said field effect transistor.

16. A field effect transistor array comprising
   a semiconductor substrate,
   a pair of spaced apart isolation strips disposed at the surface of said substrate,
   a plurality of spaced apart conductive lines extending between said isolation strips and in a substantially orthogonal relationship thereto,
   an insulating medium disposed between said conductive lines and the surface of said semiconductor substrate,
   a plurality of current-carrying electrodes disposed in said semiconductor substrate, each of said electrodes being defined by said isolation strips and adjacent pairs of said conductive lines,
   means for applying a signal voltage to selected lines of said plurality of lines,
   means for applying a reference voltage to conductive lines adjacent to said selected lines to form field shields, and
   means for providing an electrical coupling to each of said current carrying electrodes, whereby a plurality of field effect transistors are formed in said array which are electrically isolated from each other within said semiconductor material, each of said transistors including one of said selected lines and current carrying electrodes adjacent said selected lines.

17. A field effect transistor array as set forth in claim 16 wherein said isolation strips are strips of recessed silicon dioxide.

18. A field transistor array as set forth in claim 16 wherein said isolation strips include additional conductive lines.

19. A field effect transistor array as set forth in claim 18 wherein said conductive lines are made of polysilicon.

20. A memory array comprising
a semiconductor substrate,
a plurality of spaced apart isolation strips disposeed at the surface of said substrate,
a plurality of spaced apart conductive lines arranged substantially perpendicular to said strips,
an insulating medium disposed between said conductive lines and the surface of said semiconductor substrate,
means for applying a word pulse to a first plurality of selected lines of said plurality of conductive lines,
means for applying a reference voltage to a second plurality of selected lines of said plurality of conductive line, one line of said second plurality of selected lines being disposed between adjacent pairs of lines of said first plurality of selected lines,
capacitors formed on said semiconductor substrate, each of said capacitors having as a first electrode a portion of the surface of said semiconductor substrate defined by adjacent pairs of isolation strips, one of said first plurality of selected lines and one of said second plurality of selected lines adjacent said one of said first plurality of selected lines, a second electrode of said capacitor being a conductive layer disposed on said insulating medium at said portion of the surface of said semiconductor substrate,
means for applying a fixed voltage to said conductive layer of said capacitor,
a plurality of current-carrying electrodes, each of said current-carrying electrodes being disposed in said semiconductor substrate at the surface thereof defined by said adjacent pair of isolation strips, said one of said first plurality of selected lines and an adjacent conductive line opposite said capacitor, and
means for connecting a bit line to each of said current-carrying electrodes.

21. A memory array as set forth in claim 20 wherein said insulation strips are strips of recessed silicon dioxide.

22. A memory array as set forth in claim 20 wherein said insulation strips include additional conductive lines.

23. A memory array as set forth in claim 20 wherein said conductive lines are made of polysilicon.

24. A memory array as set forth in claim 23 wherein said insulating medium is a dual layer insulator, one of said layers being made of silicon nitride.

25. A memory array as set forth in claim 20 wherein each of said current-carrying electrodes is disposed between an adjacent pair of said first plurality of selected lines and the conductive layer of said capacitors disposed on opposite sides of one of said second plurality of selected lines are interconnected.

* * * * *